United States Patent
Chen et al.

(10) Patent No.: US 10,535,647 B2
(45) Date of Patent: Jan. 14, 2020

(54) ELECTROSTATIC DISCHARGE (ESD) PROTECTION CIRCUIT

(71) Applicant: MediaTek Inc., Hsin-Chu (TW)

(72) Inventors: Yu-Jen Chen, Kaohsiung (TW); Chien-Hui Chuang, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 328 days.

(21) Appl. No.: 15/149,262

(22) Filed: May 9, 2016

(65) Prior Publication Data
US 2017/0170165 A1 Jun. 15, 2017

Related U.S. Application Data

(60) Provisional application No. 62/266,081, filed on Dec. 11, 2015.

(51) Int. Cl.
*H01L 27/02* (2006.01)
*H01L 27/092* (2006.01)
(Continued)

(52) U.S. Cl.
CPC ...... *H01L 27/0248* (2013.01); *H01L 27/0629* (2013.01); *H01L 27/092* (2013.01); *H02H 9/046* (2013.01)

(58) Field of Classification Search
CPC ............... H01L 27/0248; H01L 27/092; H01L 27/0629; H01L 23/60; H01L 27/0251;
(Continued)

(56) References Cited

U.S. PATENT DOCUMENTS 6,144,542 A 11/2000 Ker et al.
7,098,511 B2 * 8/2006 Ker ..................... H01L 27/0251
257/360
(Continued)

FOREIGN PATENT DOCUMENTS

CN 101626154 A 1/2010
CN 103456721 A 12/2013
(Continued)

OTHER PUBLICATIONS

(IEEE Xplore Digital Library [online]. ieeexplore.ieee.org [retrieved on Mar. 1, 2009]. Retrieved from the Internet: <URL: https://ieeexplore.ieee.org/stamp/stamp.jsp?tp=&arnumber=4796375>.*
(Continued)

*Primary Examiner* — Thienvu V Tran
*Assistant Examiner* — Nicolas Bellido
(74) *Attorney, Agent, or Firm* — McClure, Qualey & Rodack, LLP (57) ABSTRACT

The invention provides an ESD (Electrostatic Discharge) protection circuit including a clamp circuit, a switch element, and a detection circuit. The clamp circuit is coupled between an ESD bus and a ground node. The switch element is coupled between a supply node and the ESD bus. The detection circuit is configured to detect whether an ESD event occurs. When no ESD event occurs, the detection circuit closes the switch element, such that the ESD bus is coupled to the supply node. When the ESD event occurs, the detection circuit opens the switch element, such that the ESD bus is decoupled from the supply node.

19 Claims, 7 Drawing Sheets

(51) Int. Cl.
*H01L 27/06* (2006.01)
*H02H 9/04* (2006.01)

(58) Field of Classification Search
CPC ............ H01L 27/0285; H01L 27/0292; H01L 2924/00; H01L 2924/0002; H02H 9/046; H02H 3/22; H05K 1/0259
See application file for complete search history.

(56) References Cited

U.S. PATENT DOCUMENTS

| | | | | |
|---|---|---|---|---|
| 7,518,841 | B2* | 4/2009 | Chuang | H01L 27/0285 361/56 |
| 7,593,204 | B1* | 9/2009 | Iversen | H02H 9/046 361/56 |
| 7,692,907 | B2* | 4/2010 | Chen | H01L 27/0292 361/111 |
| 7,869,174 | B2* | 1/2011 | Tanaka | H01L 27/0251 361/56 |
| 8,792,219 | B2 | 7/2014 | Lai et al. | |
| 9,225,163 | B2 | 12/2015 | Cao et al. | |
| 9,413,166 | B2 | 8/2016 | Rupp et al. | |
| 9,716,382 | B2 | 7/2017 | Ikeda | |
| 2004/0109270 | A1* | 6/2004 | Stockinger | H01L 27/0251 361/56 |
| 2006/0092590 | A1* | 5/2006 | Chuang | H01L 27/0285 361/91.1 |
| 2011/0255200 | A1* | 10/2011 | Tsai | H02H 9/046 361/56 |
| 2012/0081820 | A1 | 4/2012 | Chu et al. | |
| 2013/0321962 | A1 | 12/2013 | Lai et al. | |
| 2014/0092508 | A1 | 4/2014 | Ko et al. | |
| 2014/0126089 | A1 | 5/2014 | Chang et al. | |
| 2015/0288172 | A1* | 10/2015 | Yeh | H02H 9/046 361/56 |

FOREIGN PATENT DOCUMENTS

| | | |
|---|---|---|
| CN | 104617569 A | 5/2015 |
| CN | 104701312 A | 6/2015 |
| CN | 104810813 A | 7/2015 |

OTHER PUBLICATIONS (IEEE Xplore Digital Library [online]. ieeexplore.ieee.org [retrieved on Mar. 1, 2009]. Retrieved from the Internet: <URL: https://ieeexplore.ieee.org/stamp/stamp.jsp?tp=&arnumber=4796375>. (Year: 2009).*

* cited by examiner

ELECTROSTATIC DISCHARGE (ESD) PROTECTION CIRCUIT

CROSS REFERENCE TO RELATED APPLICATIONS

This application claims the benefit of U.S. Provisional Application No. 62/266,081, filed on Dec. 11, 2015, the entirety of which is incorporated by reference herein.

BACKGROUND OF THE INVENTION

Field of the Invention

The disclosure generally relates to an ESD (Electrostatic Discharge) protection circuit, and more specifically, to an ESD protection circuit for voltage stabilization.

Description of the Related Art

ESD (Electrostatic Discharge) is the sudden flow of electricity between two electrically charged objects caused by contact, an electrical short, or dielectric breakdown. Manufacturers and users of integrated circuits must take precautions to avoid ESD. ESD prevention can be part of the device itself and include special design techniques for device input and output pins. External protection components can also be used with circuit layout.

For a conventional ESD protection circuit, a coupling path is always formed from an I/O (Input/Output) node to a supply node. When an ESD event occurs, the disturbance at the I/O node may cause another disturbance at the supply node, and it may damage sensitive components coupled to the supply node. Also, other adjacent I/O nodes may be affected by the disturbance through the mutual coupling therebetween. Accordingly, there is a need to propose a novel solution for solving the problem of the prior art.

BRIEF SUMMARY OF THE INVENTION

In a preferred embodiment, the disclosure is directed to an ESD (Electrostatic Discharge) protection circuit including a clamp circuit, a switch element, and a detection circuit. The clamp circuit is coupled between an ESD bus and a ground node. The switch element is coupled between a supply node and the ESD bus. The detection circuit is configured to detect whether an ESD event occurs. When the ESD event does not occur, the detection circuit closes the switch element, such that the ESD bus is coupled to the supply node. When the ESD event occurs, the detection circuit opens the switch element, such that the ESD bus is decoupled from the supply node.

In some embodiments, when the ESD event does not occur, the clamp circuit is open-circuited, and when the ESD event occurs, the clamp circuit forms a current path from the ESD bus to the ground node.

In some embodiments, the ESD protection circuit further includes an I/O (Input/Output) pad, a first diode, and a second diode. The first diode has an anode coupled to the I/O pad, and a cathode coupled to the ESD bus. The second diode has an anode coupled to the ground node, and a cathode coupled to the I/O pad.

In some embodiments, the ESD protection circuit further includes a pulling-up circuit, a pulling-down circuit, and a pre-driver. The pulling-up circuit selectively couples the supply node to the I/O pad. The pulling-down circuit selectively couples the ground node to the I/O pad. The pre-driver controls the pulling-up circuit and the pulling-down circuit.

In some embodiments, the pulling-up circuit is a first transistor which has a control terminal coupled to the pre-driver, a first terminal coupled to the supply node, and a second terminal coupled to the I/O pad. The pulling-down circuit is a second transistor which has a control terminal coupled to the pre-driver, a first terminal coupled to the I/O pad, and a second terminal coupled to the ground node.

In some embodiments, the first transistor is a PMOS transistor (P-type Metal-Oxide-Semiconductor Field-Effect Transistor), and the second transistor is an NMOS transistor (N-type Metal-Oxide-Semiconductor Field-Effect Transistor).

In some embodiments, the detection circuit includes a first resistor and a second resistor. The first resistor is coupled between the ESD bus and a median node. The second resistor is coupled between the median node and the ground node.

In some embodiments, a resistance of the second transistor is the same as a resistance of the first resistor.

In some embodiments, the detection circuit further includes a third transistor and a fourth transistor. The third transistor has a control terminal coupled to the supply node, a first terminal coupled to the median node, and a second terminal coupled to a first node. The fourth transistor has a control terminal coupled to the supply node, a first terminal coupled to the ESD bus, and a second terminal coupled to the first node.

In some embodiments, the third transistor is an NMOS transistor (N-type Metal-Oxide-Semiconductor Field-Effect Transistor), and the fourth transistor is a PMOS transistor (P-type Metal-Oxide-Semiconductor Field-Effect Transistor).

In some embodiments, the switch element includes a fifth transistor. The fifth transistor has a control terminal coupled to the first node, a first terminal coupled to the supply node, a second terminal coupled to the ESD bus, and a bulk terminal coupled to the ESD bus.

In some embodiments, the fifth transistor is a PMOS transistor (P-type Metal-Oxide-Semiconductor Field-Effect Transistor).

In some embodiments, when the ESD event does not occur, the third transistor is turned on and the fourth transistor is turned off, such that the fifth transistor is turned on. When the ESD event occurs, the third transistor is turned off and the fourth transistor is turned on, such that the fifth transistor is turned off.

In some embodiments, the detection circuit further includes a sixth transistor and a seventh transistor. The sixth transistor has a control terminal coupled to the median node, a first terminal coupled to the supply node, and a second terminal coupled to a second node. The seventh transistor has a control terminal coupled to the supply node, a first terminal coupled to the median node, and a second terminal coupled to the second node.

In some embodiments, the sixth transistor and the seventh transistor are PMOS transistors (P-type Metal-Oxide-Semiconductor Field-Effect Transistors).

In some embodiments, the detection circuit further includes an eighth transistor and a ninth transistor. The eighth transistor has a control terminal coupled to the supply node, a first terminal coupled to the median node, and a second terminal coupled to a third node. The ninth transistor has a control terminal coupled to the second node, a first terminal coupled to the third node, and a second terminal coupled to the ESD bus.

In some embodiments, the eighth transistor is an NMOS transistor (N-type Metal-Oxide-Semiconductor Field-Effect Transistor), and the ninth transistor is a PMOS transistor (P-type Metal-Oxide-Semiconductor Field-Effect Transistor).

In some embodiments, the switch element includes a tenth transistor and an eleventh transistor. The tenth transistor has a control terminal coupled to the median node, a first terminal coupled to the supply node, a second terminal coupled to a fourth node, and a bulk terminal coupled to the supply node. The eleventh transistor has a control terminal coupled to the third node, a first terminal coupled to the fourth node, a second terminal coupled to the ESD bus, and a bulk terminal coupled to the ESD bus.

In some embodiments, the tenth transistor and the eleventh transistor are PMOS transistors (P-type Metal-Oxide-Semiconductor Field-Effect Transistors).

In some embodiments, when the ESD event does not occur, the sixth transistor is turned on, the seventh transistor is turned off, the eighth transistor is turned on, and the ninth transistor is turned off, such that the tenth transistor and the eleventh transistor are both turned on. When the ESD event occurs, the ninth transistor is turned on, such that the eleventh transistor is turned off.

In another preferred embodiment, the disclosure is directed to a method for ESD (Electrostatic Discharge) protection. The method includes the steps of: providing a clamp circuit and a switch element, wherein the clamp circuit is coupled between an ESD bus and a ground node, and the switch element is coupled between a supply node and the ESD bus; detecting whether an ESD event occurs; when the ESD event does not occur, closing the switch element such that the ESD bus is coupled to the supply node; and when the ESD event occurs, opening the switch element such that the ESD bus is decoupled from the supply node.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention will be described in detail as follows.

Figure 1:
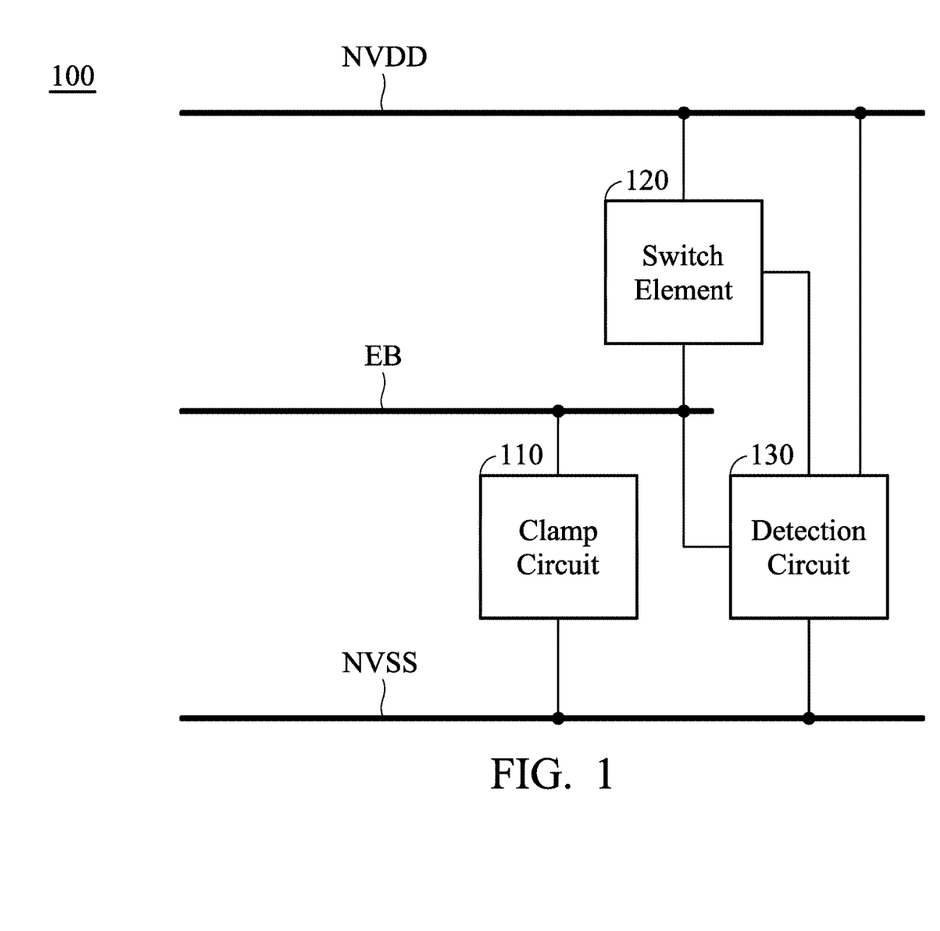
FIG. 1 is a diagram of an ESD (Electrostatic Discharge) protection circuit according to an embodiment of the invention.

FIG. 1 is a diagram of an ESD (Electrostatic Discharge) protection circuit 100 according to an embodiment of the invention. The ESD protection circuit 100 may be applied to integrated circuits in a mobile device, such as a smartphone, a tablet computer, or a notebook computer. As shown in FIG. 1, the ESD protection circuit 100 includes a clamp circuit 110, a switch element 120, and a detection circuit 130. The clamp circuit 110 is coupled between an ESD bus EB and a ground node NVSS. The switch element 120 is coupled between a supply node NVDD and the ESD bus EB. In a normal operation mode, the ESD bus EB is different from the supply node NVDD, and the voltage at the ESD bus EB follows a supply voltage (e.g., 1.8V or 3.3V, but not limited thereto) at the supply node NVDD. The detection circuit 130 is configured to detect whether an ESD event occurs. When no ESD event occurs, the clamp circuit 110 is open-circuited, and the detection circuit 130 closes the switch element 120, such that the ESD bus EB is coupled to the supply node NVDD. Conversely, when the ESD event occurs, the clamp circuit 110 forms a current path from the ESD bus EB to the ground node NVSS, and the detection circuit 130 opens the switch element 120, such that the ESD bus EB is decoupled from the supply node NVDD. With the above design, the ESD disturbance at the ESD bus EB is almost isolated from the supply node NVDD. Even if an ESD event occurs, it will not affect the voltage at the supply node NVDD, and therefore other sensitive components coupled to the supply node NVDD will be well protected.

The detailed features of the proposed ESD protection circuit 100 will be described in the following embodiments. It should be understood that these embodiments and figures are just exemplary, rather than restricted limitations of the invention.

Figure 2:
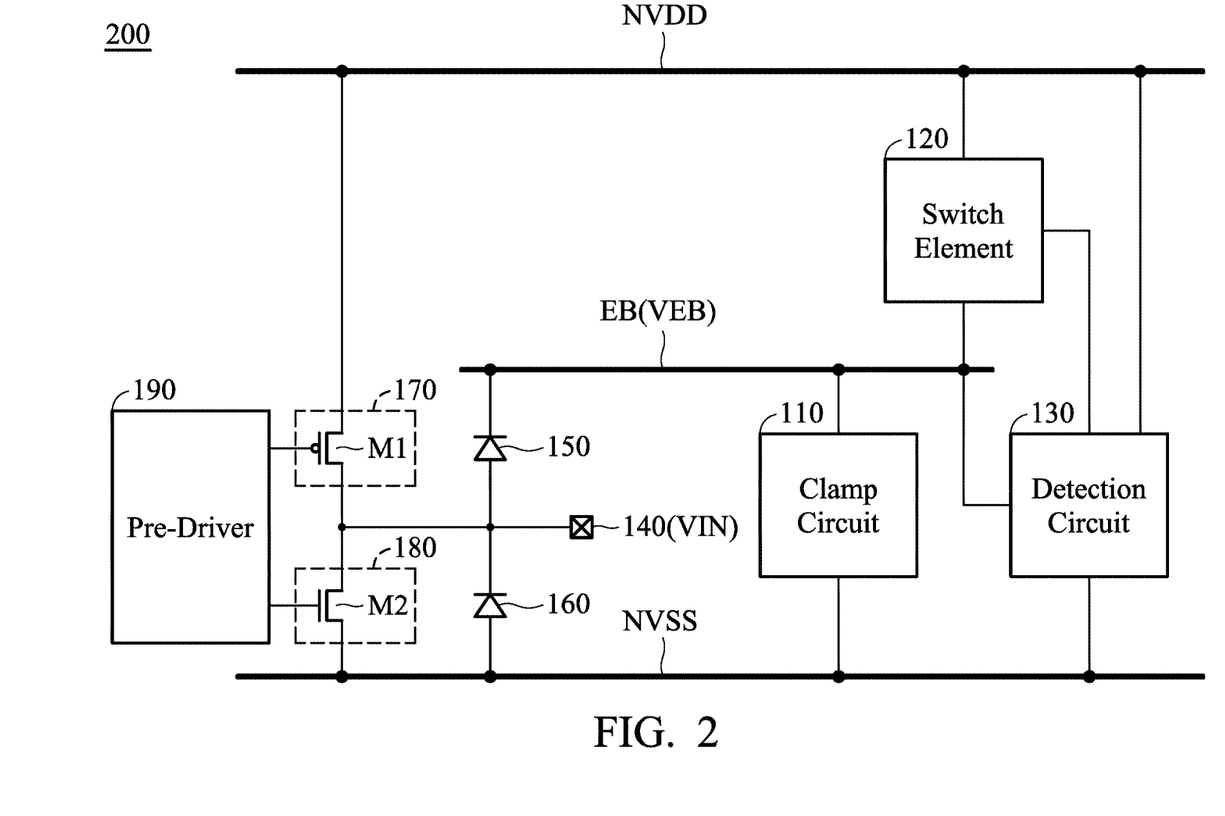
FIG. 2 is a diagram of an ESD protection circuit according to an embodiment of the invention.

FIG. 2 is a diagram of an ESD protection circuit 200 according to an embodiment of the invention. FIG. 2 is similar to FIG. 1. In the embodiment of FIG. 2, the ESD protection circuit 200 further includes an I/O (Input/Output) pad 140, a first diode 150, a second diode 160, a pulling-up circuit 170, a pulling-down circuit 180, and a pre-driver 190. The first diode 150 has an anode coupled to the I/O pad 140, and a cathode coupled to the ESD bus EB. The second diode 160 has an anode coupled to the ground node NVSS, and a cathode coupled to the I/O pad 140. The pulling-up circuit 170 is configured to selectively couple the supply node NVDD to the I/O pad 140. The pulling-down circuit 180 is configured to selectively couple the ground node NVSS to the I/O pad 140. The pre-driver 190 is configured to control the closing and opening states of the pulling-up circuit 170 and the pulling-down circuit 180, so as to generate up and down logic level toggles at the I/O pads. For example, the pulling-up circuit 170 may be a first transistor M1 which has a control terminal coupled to the pre-driver 190, a first terminal coupled to the supply node NVDD, and a second terminal coupled to the I/O pad 140. The pulling-down circuit 180 may be a second transistor M2 which has a control terminal coupled to the pre-driver 190, a first terminal coupled to the I/O pad 140, and a second terminal coupled to the ground node NVSS. The first transistor M1 may be a PMOS transistor (P-type Metal-Oxide-Semiconductor Field-Effect Transistor), and the second transistor M2 may be an NMOS transistor (N-type Metal-Oxide-Semiconductor Field-Effect Transistor).

In some embodiment, the aforementioned ESD event includes an ESD test process. During the ESD test process, both of the supply node NVDD and the ground node NVSS are set to a ground voltage (e.g., 0V), and a large amount of (positive or negative) electric charges accumulated at the I/O pad 140 start to discharge fast. For example, these electric charges may be discharged through the ESD bus EB and the current path of the clamp circuit 110, and therefore the ESD bus EB may have a high voltage pulse during the occurrence of the ESD event. In the time periods other than the ESD event, the ESD protection circuit 200 may work in a normal operation mode with a high supply voltage (e.g., 1.8V or 3.3V) at the supply node NVDD and a low ground voltage (e.g., 0V) at the ground node NVSS.

Figure 3:
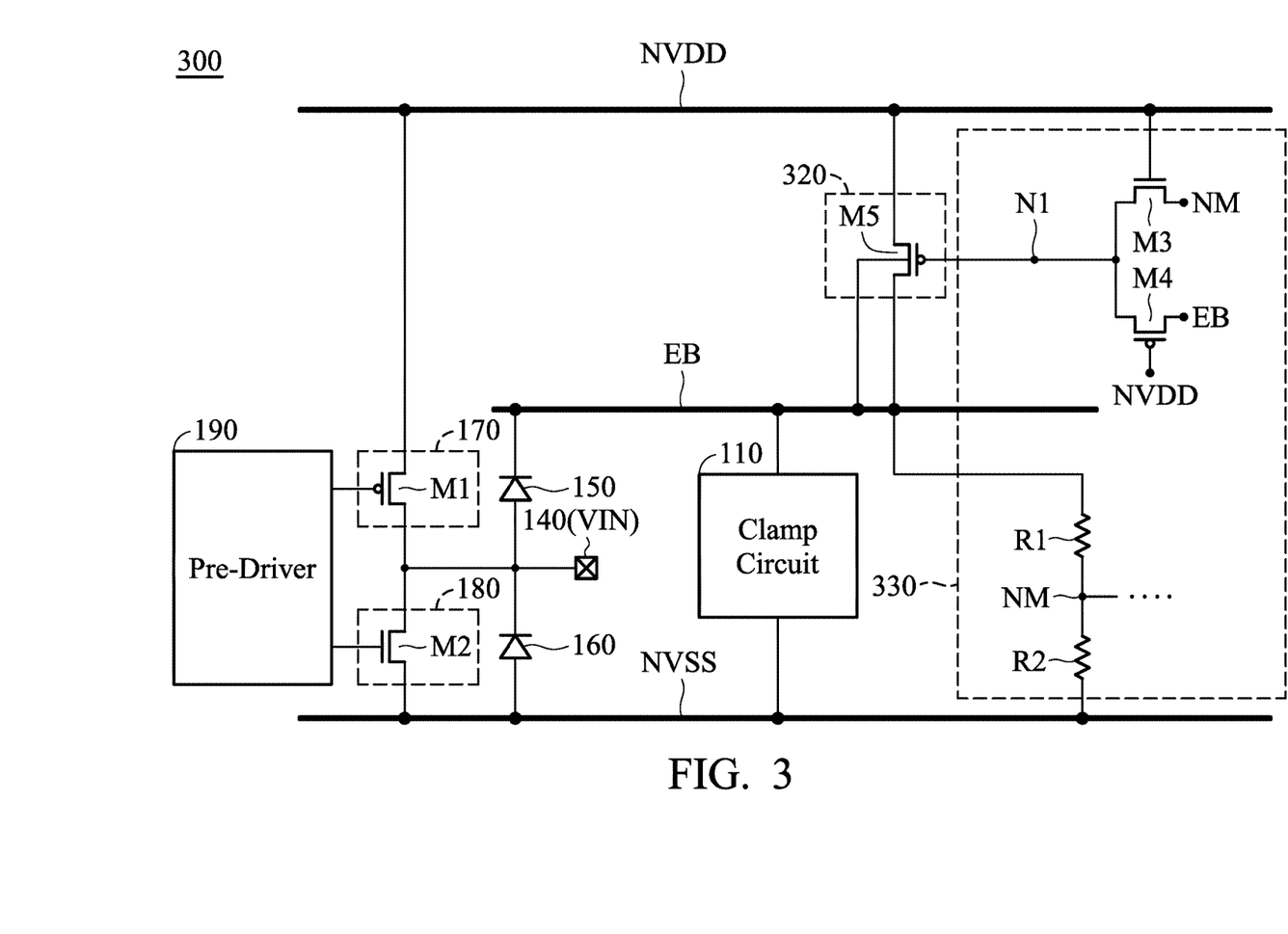
FIG. 3 is a diagram of an ESD protection circuit according to an embodiment of the invention.

FIG. 3 is a diagram of an ESD protection circuit 300 according to an embodiment of the invention. FIG. 3 is similar to FIG. 2. In the embodiment of FIG. 3, a detection circuit 330 of the ESD protection circuit 300 includes a first resistor R1, a second resistor R2, a third transistor M3, and a fourth transistor M4; and a switch element 320 of the ESD protection circuit 300 includes a fifth transistor M5. The first resistor R1 is coupled between the ESD bus EB and a median node NM. The second resistor R2 is coupled between the median node NM and the ground node NVSS. The resistance of the second resistor R2 may be the same as the resistance of the first resistor R1, such that the voltage at the median node NM may be a half of the voltage at the ESD bus EB. The third transistor M3 may be an NMOS transistor, and the fourth transistor M4 may be a PMOS transistor. The third transistor M3 has a control terminal coupled to the supply node NVDD, a first terminal coupled to the median node NM, and a second terminal coupled to a first node N1. The fourth transistor M4 has a control terminal coupled to the supply node NVDD, a first terminal coupled to the ESD bus EB, and a second terminal coupled to the first node N1. The fifth transistor M5 may be a PMOS transistor. The fifth transistor M5 has a control terminal coupled to the first node N1, a first terminal coupled to the supply node NVDD, a second terminal coupled to the ESD bus EB, and a bulk terminal coupled to the ESD bus EB.

In some embodiments, the ESD protection circuit 300 of FIG. 3 operates as follows. When no ESD event occurs (e.g., during a normal operation process), the third transistor M3 is turned on and the fourth transistor M4 is turned off. The voltage at the first node N1 is approximately equal to the voltage at the median node NM. Accordingly, the fifth transistor M5 is turned on, and the ESD bus EB is coupled to the supply node NVDD. It should be noted that the turned-on resistance of the fifth transistor M5 is very low, and therefore the voltage at the ESD bus EB is substantially equal to the voltage at the supply node NVDD. That is, the ESD bus EB is tied to the supply node NVDD and has good voltage stability. On the other hand, when the ESD event occurs (i.e., during an ESD test process), the third transistor M3 is turned off and the fourth transistor M4 is turned on (because the supply node NVDD is set to a ground voltage). The voltage at the first node N1 is approximately equal to the voltage at the ESD bus EB (i.e., a high voltage pulse). Accordingly, the fifth transistor M5 is turned off, and the ESD bus EB is decoupled from the supply node NVDD. The above operations are used for enhancing the voltage stability. Specifically, it can suppress the voltage fluctuations at the ESD bus EB during the normal operation process, and protect the sensitive components coupled to the supply node NVDD during the ESD test process.

Figure 4:
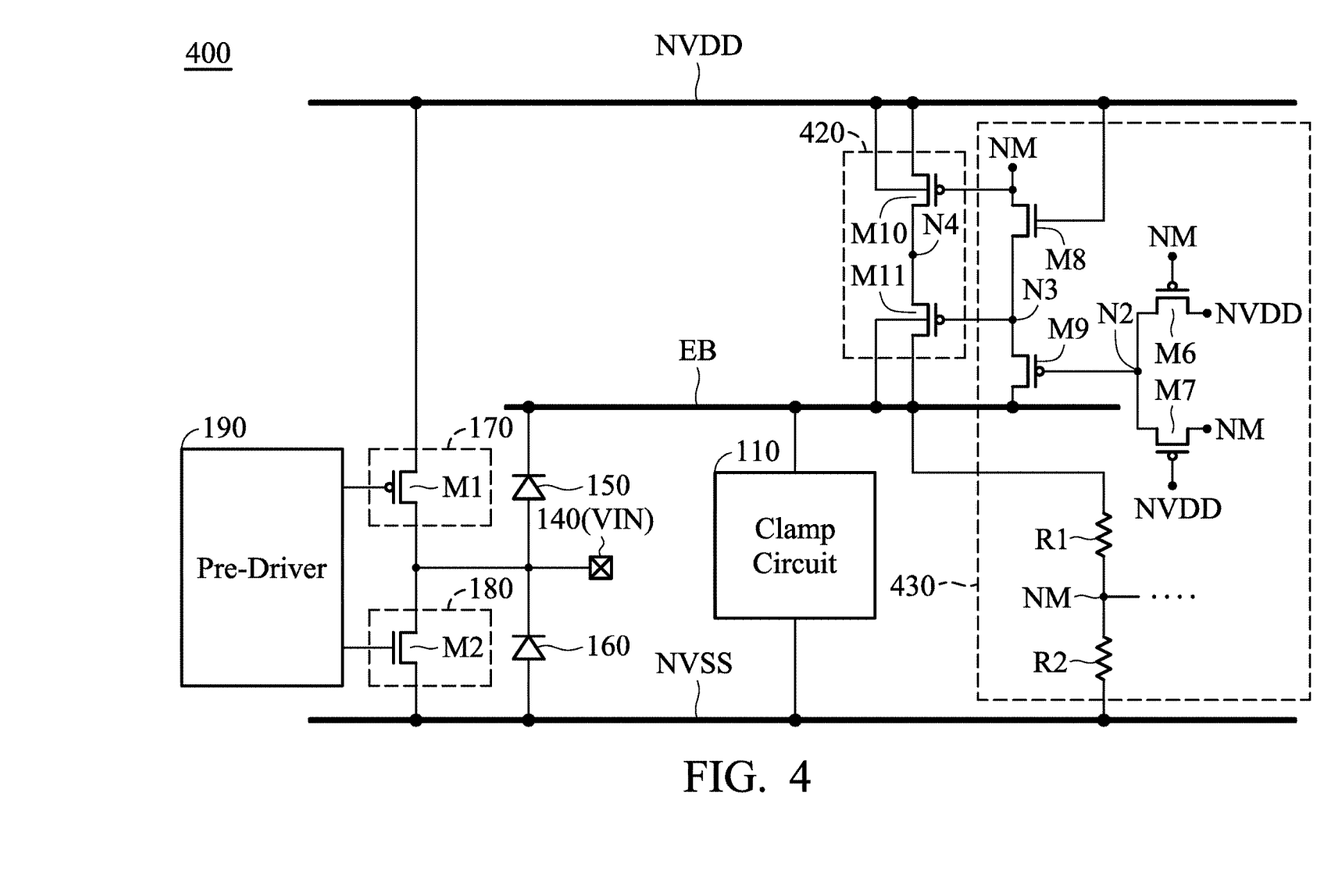
FIG. 4 is a diagram of an ESD protection circuit according to an embodiment of the invention.

FIG. 4 is a diagram of an ESD protection circuit 400 according to an embodiment of the invention. FIG. 4 is similar to FIG. 2. In the embodiment of FIG. 4, a detection circuit 430 of the ESD protection circuit 400 includes a first resistor R1, a second resistor R2, a sixth transistor M6, a seventh transistor M7, an eighth transistor M8, and a ninth transistor M9; and a switch element 420 of the ESD protection circuit 400 includes a tenth transistor M10 and an eleventh transistor M11. The first resistor R1 is coupled between the ESD bus EB and a median node NM. The second resistor R2 is coupled between the median node NM and the ground node NVSS. The resistance of the second resistor R2 may be the same as the resistance of the first resistor R1, such that the voltage at the median node NM may be a half of the voltage at the ESD bus EB. The sixth transistor M6 and the seventh transistor M7 may be PMOS transistors. The sixth transistor M6 has a control terminal coupled to the median node NM, a first terminal coupled to the supply node NVDD, and a second terminal coupled to a second node N2. The seventh transistor M7 has a control terminal coupled to the supply node NVDD, a first terminal coupled to the median node NM, and a second terminal coupled to the second node N2. The eighth transistor M8 may be an NMOS transistor, and the ninth transistor M9 may be a PMOS transistor. The eighth transistor M8 has a control terminal coupled to the supply node NVDD, a first terminal coupled to the median node NM, and a second terminal coupled to a third node N3. The ninth transistor M9 has a control terminal coupled to the second node N2, a first terminal coupled to the third node N3, and a second terminal coupled to the ESD bus EB. The tenth transistor M10 and the eleventh transistor M11 may be PMOS transistors. The tenth transistor M10 has a control terminal coupled to the median node NM, a first terminal coupled to the supply node NVDD, a second terminal coupled to a fourth node N4, and a bulk terminal coupled to the supply node NVDD. The eleventh transistor M11 has a control terminal coupled to the third node N3, a first terminal coupled to the fourth node N4, a second terminal coupled to the ESD bus EB, and a bulk terminal coupled to the ESD bus EB.

In some embodiments, the ESD protection circuit 400 of FIG. 4 operates as follows. When no ESD event occurs (e.g., during a normal operation process), the sixth transistor M6 is turned on and the seventh transistor M7 is turned off. The voltage at the second node N2 is approximately equal to the voltage at the supply node NVDD, such that the ninth transistor M9 is turned off. The eighth transistor M8 is turned on, and the voltage at the third node N3 is approximately equal to the voltage at the median node NM. Accordingly, the tenth transistor M10 and the eleventh transistor M11 are both turned on, and the ESD bus EB is coupled to the supply node NVDD. It should be noted that the turned-on resistances of the tenth transistor M10 and the eleventh transistor M11 are very low, and therefore the voltage at the ESD bus EB is substantially equal to the voltage at the supply node NVDD. That is, the ESD bus EB is tied to the supply node NVDD and has good voltage stability. On the other hand, when the ESD event occurs (i.e., during an ESD test process), the sixth transistor M6 and the seventh transistor M7 are both turned off (because there is no sufficient gate-to-source voltage difference for each transistor). It should be noted that the voltage at the median node NM is almost equal to the ground voltage during the ESD event since the high voltage pulse at the ESD bus EB has duration that is too short to pull up the voltage at the median node NM by a small charging current through the first resistor R1 and the second resistor R2. The voltage at the second node N2 is maintained at the ground voltage, such that the ninth transistor M9 is turned on. Then, the voltage at the third node N3 is pulled up by the high voltage pulse at the ESD bus EB during the ESD event. Accordingly, the eleventh transistor M11 is turned off, and the ESD bus EB is decoupled from the supply node NVDD. The above operations are used for enhancing the voltage stability. Specifically, it can suppress the voltage fluctuations at the ESD bus EB during the normal operation process, and protect the sensitive components coupled to the supply node NVDD during the ESD test process. The embodiment of FIG. 4 reduces the respective voltage difference across each transistor, and this is more suitable for application in advanced semiconductor manufacturing process.

Figure 5:
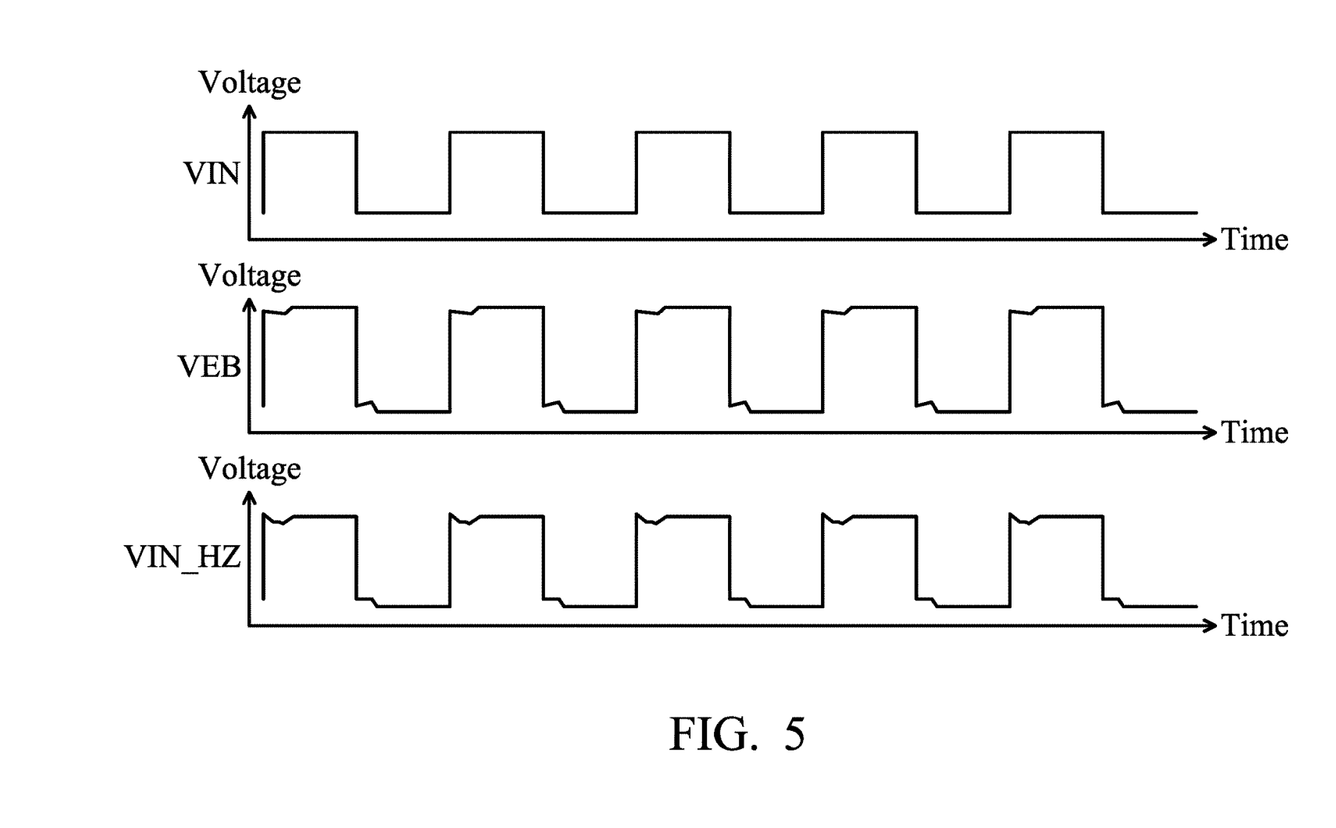
FIG. 5 is a diagram of signal waveforms of a conventional ESD protection circuit.

FIG. 5 is a diagram of signal waveforms of a conventional ESD protection circuit. The horizontal axis represents time, and the vertical axis represents the respective voltage level of each signal. The conventional ESD protection circuit does not include the detection circuit 130 for controlling the switch element 120. For a conventional ESD protection circuit, during a normal operation process (i.e., when no ESD event occurs), if the voltage VIN at the I/O pad 140 has up and down logic level toggles, it will cause serious fluctuations in the voltage VEB at the ESD bus EB, and further cause serious fluctuations in the voltage VIN_HZ at other float (high-impedance) I/O pads adjacent to the I/O pad 140. That is, the drawback of the conventional ESD protection circuit is directed to its poor voltage stability.

Figure 6:
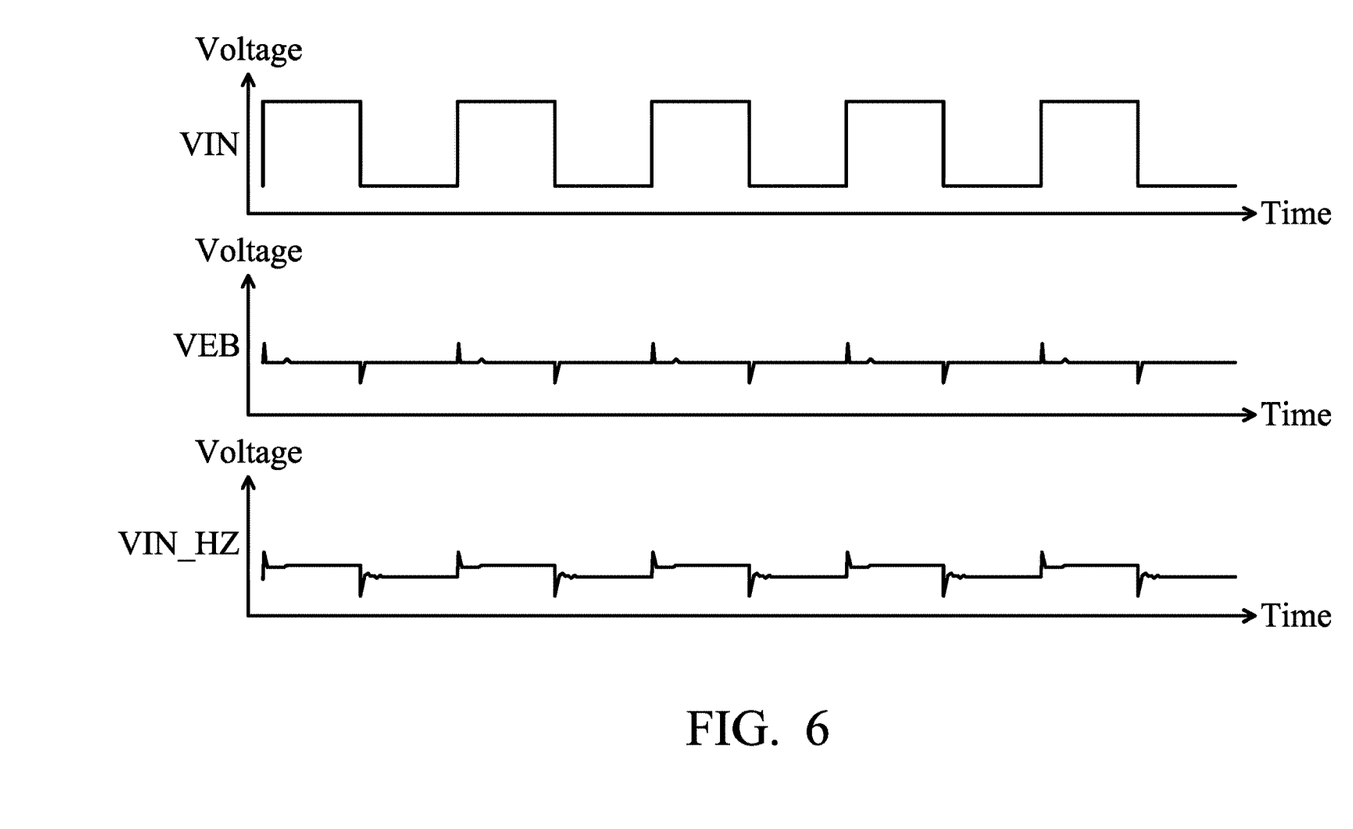
FIG. 6 is a diagram of signal waveforms of an ESD protection circuit according to an embodiment of the invention.

FIG. 6 is a diagram of signal waveforms of the proposed ESD protection circuit 100 according to an embodiment of the invention. The horizontal axis represents time, and the vertical axis represents the respective voltage level of each signal. The proposed ESD protection circuit 100 includes the switch element 120 and the detection circuit 130. For the proposed ESD protection circuit 100, during a normal operation process (i.e., when no ESD event occurs), if the voltage VIN at the I/O pad 140 has up and down logic level toggles, there will be very small fluctuations in the voltage VEB at the ESD bus EB, and very small fluctuations in the voltage VIN_HZ at other float (high-impedance) I/O pads adjacent to the I/O pad 140. In other words, the invention significantly enhances the voltage stability of the ESD protection circuit, thereby preventing sensitive components from being damaged.

Figure 7:
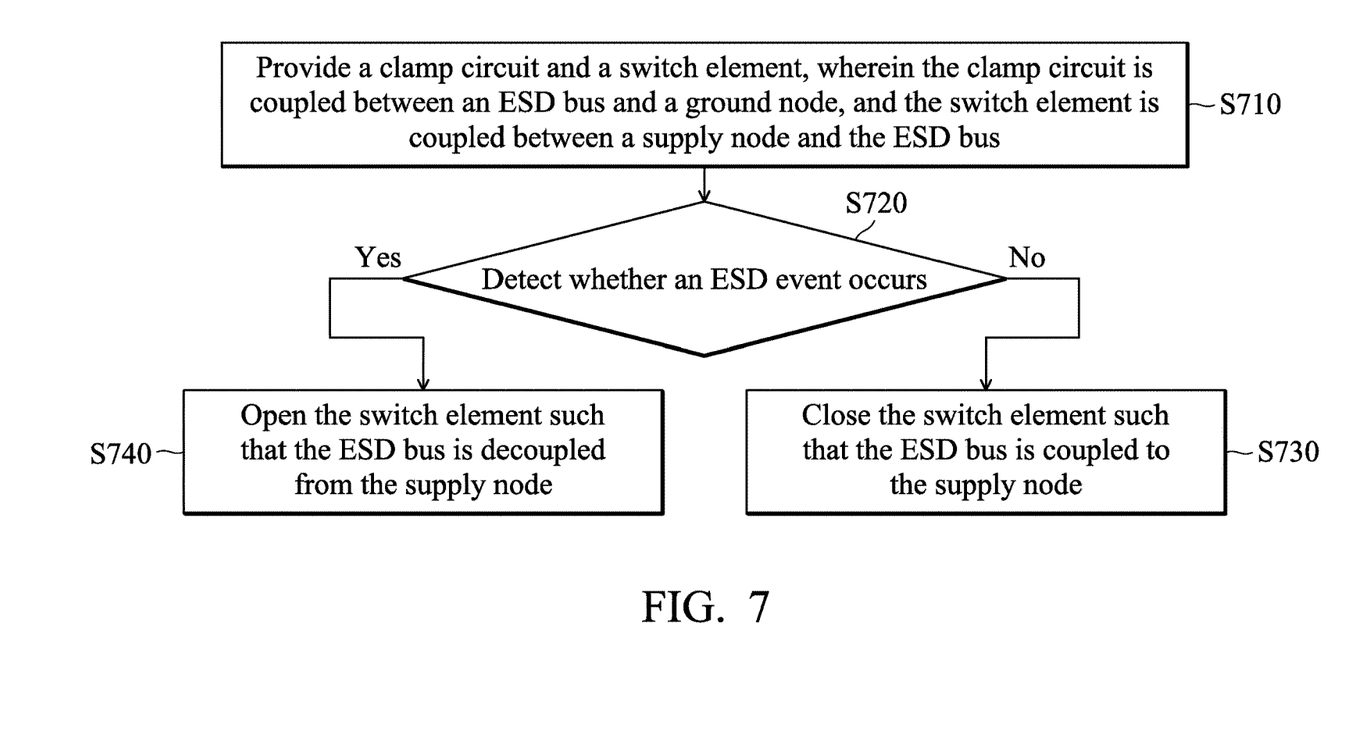
FIG. 7 is a flowchart of a method for ESD protection according to an embodiment of the invention.

FIG. 7 is a flowchart of a method for ESD protection according to an embodiment of the invention. In step S710, a clamp circuit and a switch element are provided. The clamp circuit is coupled between an ESD bus and a ground node. The switch element is coupled between a supply node and the ESD bus. In step S720, whether an ESD event occurs is detected. When no ESD event occurs, in step S730, the switch element is closed, such that the ESD bus is coupled to the supply node. When the ESD event occurs, in step S740, the switch element is opened, such that the ESD bus is decoupled from the supply node. It should be noted that the above steps are not required to be performed in order, and every feature of the embodiments of FIGS. 1-6 may be applied to the method of the embodiment of FIG. 7.

The invention proposes a novel ESD protection circuit and a method thereof. In comparison to the conventional design, the invention has at least the advantages of: (1) enhancing the voltage stability of the ESD protection circuit; (2) suppressing the mutual coupling between adjacent I/O pads; and (3) improving the performance of the ESD protection circuit in both an AC (Alternating Current) small-signal mode and a DC (Direct Current) bias mode.

The above parameters, such as the values of voltages, currents, or resistances, are just exemplary, rather than restricted limitations of the invention. Designers can fine tune these parameters in response to different requirements. It is understood that the ESD protection circuit and the method for ESD protection are not limited to the configurations of FIGS. 1-7. The invention may merely include any one or more features of any one or more embodiments of FIGS. 1-7. In other words, not all of the features shown in the figures should be implemented in the ESD protection circuit and the method for ESD protection of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An ESD (Electrostatic Discharge) protection circuit, comprising:
   a clamp circuit, coupled between an ESD bus and a ground node;
   a switch element, coupled between a supply node and the ESD bus, wherein the clamp circuit is not directly connected to the supply node; and
   a detection circuit, detecting whether an ESD event occurs;
   wherein when the ESD event does not occur, the detection circuit closes the switch element such that the ESD bus is coupled to the supply node, and when the ESD event occurs, the detection circuit opens the switch element such that the ESD bus is decoupled from the supply node;
   wherein the detection circuit comprises:
   a first resistor, coupled between the ESD bus and a median node;
   a second resistor, coupled between the median node and the ground node;
   a third transistor, wherein the third transistor has a control terminal coupled to the supply node, a first terminal coupled to the median node, and a second terminal coupled to a first node; and
   a fourth transistor, wherein the fourth transistor has a control terminal coupled to the supply node, a first terminal coupled to the ESD bus, and a second terminal coupled to the first node.

2. The ESD protection circuit as claimed in claim 1, wherein when the ESD event does not occur, the clamp circuit is open-circuited, and when the ESD event occurs, the clamp circuit forms a current path from the ESD bus to the ground node.

3. The ESD protection circuit as claimed in claim 1, further comprising:
   an I/O (Input/Output) pad;
   a first diode, wherein the first diode has an anode coupled to the I/O pad, and a cathode coupled to the ESD bus; and
   a second diode, wherein the second diode has an anode coupled to the ground node, and a cathode coupled to the I/O pad.

4. The ESD protection circuit as claimed in claim 3, further comprising:
   a pulling-up circuit, selectively coupling the supply node to the I/O pad;
   a pulling-down circuit, selectively coupling the ground node to the I/O pad; and
   a pre-driver, controlling the pulling-up circuit and the pulling-down circuit.

5. The ESD protection circuit as claimed in claim 4, wherein the pulling-up circuit is a first transistor which has a control terminal coupled to the pre-driver, a first terminal coupled to the supply node, and a second terminal coupled to the I/O pad, and wherein the pulling-down circuit is a second transistor which has a control terminal coupled to the pre-driver, a first terminal coupled to the I/O pad, and a second terminal coupled to the ground node.

6. The ESD protection circuit as claimed in claim 5, wherein the first transistor is a PMOS transistor (P-type Metal-Oxide-Semiconductor Field-Effect Transistor), and the second transistor is an NMOS transistor (N-type Metal-Oxide-Semiconductor Field-Effect Transistor).

7. The ESD protection circuit as claimed in claim 1, wherein a resistance of the second resistor is the same as a resistance of the first resistor.

8. The ESD protection circuit as claimed in claim 1, wherein the third transistor is an NMOS transistor (N-type Metal-Oxide-Semiconductor Field-Effect Transistor), and the fourth transistor is a PMOS transistor (P-type Metal-Oxide-Semiconductor Field-Effect Transistor).

9. The ESD protection circuit as claimed in claim 1, wherein the switch element comprises:
a fifth transistor, wherein the fifth transistor has a control terminal coupled to the first node, a first terminal coupled to the supply node, a second terminal coupled to the ESD bus, and a bulk terminal coupled to the ESD bus.

10. The ESD protection circuit as claimed in claim 9, wherein the fifth transistor is a PMOS transistor (P-type Metal-Oxide-Semiconductor Field-Effect Transistor).

11. The ESD protection circuit as claimed in claim 9, wherein when the ESD event does not occur, the third transistor is turned on and the fourth transistor is turned off, such that the fifth transistor is turned on, and wherein when the ESD event occurs, the third transistor is turned off and the fourth transistor is turned on, such that the fifth transistor is turned off.

12. The ESD protection circuit as claimed in claim 1, wherein the detection circuit further comprises:
a sixth transistor, wherein the sixth transistor has a control terminal coupled to the median node, a first terminal coupled to the supply node, and a second terminal coupled to a second node; and
a seventh transistor, wherein the seventh transistor has a control terminal coupled to the supply node, a first terminal coupled to the median node, and a second terminal coupled to the second node.

13. The ESD protection circuit as claimed in claim 12, wherein the sixth transistor and the seventh transistor are PMOS transistors (P-type Metal-Oxide-Semiconductor Field-Effect Transistors).

14. The ESD protection circuit as claimed in claim 12, wherein the detection circuit further comprises:
an eighth transistor, wherein the eighth transistor has a control terminal coupled to the supply node, a first terminal coupled to the median node, and a second terminal coupled to a third node; and
a ninth transistor, wherein the ninth transistor has a control terminal coupled to the second node, a first terminal coupled to the third node, and a second terminal coupled to the ESD bus.

15. The ESD protection circuit as claimed in claim 14, wherein the eighth transistor is an NMOS transistor (N-type Metal-Oxide-Semiconductor Field-Effect Transistor), and the ninth transistor is a PMOS transistor (P-type Metal-Oxide-Semiconductor Field-Effect Transistor).

16. The ESD protection circuit as claimed in claim 14, wherein the switch element comprises:
a tenth transistor, wherein the tenth transistor has a control terminal coupled to the median node, a first terminal coupled to the supply node, a second terminal coupled to a fourth node, and a bulk terminal coupled to the supply node; and
an eleventh transistor, wherein the eleventh transistor has a control terminal coupled to the third node, a first terminal coupled to the fourth node, a second terminal coupled to the ESD bus, and a bulk terminal coupled to the ESD bus.

17. The ESD protection circuit as claimed in claim 16, wherein the tenth transistor and the eleventh transistor are PMOS transistors (P-type Metal-Oxide-Semiconductor Field-Effect Transistors).

18. The ESD protection circuit as claimed in claim 16, wherein when the ESD event does not occur, the sixth transistor is turned on, the seventh transistor is turned off, the eighth transistor is turned on, and the ninth transistor is turned off, such that the tenth transistor and the eleventh transistor are both turned on, and wherein when the ESD event occurs, the ninth transistor is turned on, such that the eleventh transistor is turned off.

19. A method for ESD (Electrostatic Discharge) protection, comprising the steps of:
providing a clamp circuit and a switch element, wherein the clamp circuit is coupled between an ESD bus and a ground node, and the switch element is coupled between a supply node and the ESD bus, and wherein the clamp circuit is not directly connected to the supply node;
detecting whether an ESD event occurs by a detection circuit;
when the ESD event does not occur, closing the switch element by the detection circuit such that the ESD bus is coupled to the supply node; and
when the ESD event occurs, opening the switch element by the detection circuit such that the ESD bus is decoupled from the supply node;
wherein the detection circuit comprises a first resistor and a second resistor, wherein the first resistor is coupled between the ESD bus and a median node, and wherein the second resistor is coupled between the median node and the ground node;
wherein the detection circuit further comprises a third transistor and a fourth transistor, wherein the third transistor has a control terminal coupled to the supply node, a first terminal coupled to the median node, and a second terminal coupled to a first node, and wherein the fourth transistor has a control terminal coupled to the supply node, a first terminal coupled to the ESD bus, and a second terminal coupled to the first node.

* * * * *